(12) United States Patent
Redman-White

(10) Patent No.: US 6,384,684 B1
(45) Date of Patent: May 7, 2002

(54) AMPLIFIER

(75) Inventor: William Redman-White, Romsey (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/710,917

(22) Filed: Nov. 13, 2000

(30) Foreign Application Priority Data

Nov. 13, 1999 (GB) .............................................. 9926956

(51) Int. Cl.⁷ .............................. H03F 3/18; H03F 3/26
(52) U.S. Cl. ........................ 330/263; 330/264; 330/267; 330/268
(58) Field of Search ................................ 330/263, 264, 330/267, 268

(56) References Cited

U.S. PATENT DOCUMENTS

| | | | | |
|---|---|---|---|---|
| 3,995,228 A | * | 11/1976 | Pass ............................ | 330/267 |
| 4,038,607 A | * | 7/1977 | Schade, Jr. .................. | 330/267 |
| 4,728,903 A | * | 3/1988 | Reiffin ......................... | 330/264 |
| 4,752,745 A | * | 6/1988 | Pass ............................ | 330/265 |
| 5,475,343 A | | 12/1995 | Bee .............................. | 330/255 |
| 5,726,602 A | * | 3/1998 | Brown ......................... | 330/255 |
| 5,754,078 A | | 5/1998 | Tamagawa ................... | 330/255 |
| 5,815,040 A | | 9/1998 | Barbetta ...................... | 330/264 |

FOREIGN PATENT DOCUMENTS

| | | |
|---|---|---|
| EP | 0409476 A2 | 1/1991 |
| WO | 0007292 A1 | 2/2000 |

* cited by examiner

*Primary Examiner*—Robert Pascal
*Assistant Examiner*—Patricia T. Nguyen

(57) ABSTRACT

A class AB amplifier having an output stage comprising complementary common source transistors (T1, T2) has means for setting the quiescent current. These comprise a bias resistor (R1) through which a bias current is passed and which is connected between the gates of transistors (T1 and T2) to set their voltages. The current through the bias resistor (R1) is derived from two reference transistors (T3 and T4) which each have the desired quiescent current passed through them by current sources (3, 5). The gate voltages of the reference transistors (T3, T4) are applied across a reference resistor (R2) and the current through the reference resistor (R2) is mirrored (T5 to T9) to the bias resistor (R1).

7 Claims, 4 Drawing Sheets

AMPLIFIER

BACKGROUND OF THE INVENTION

The invention relates to an amplifier and particularly, but not exclusively, to an amplifier suitable for use with low power supply voltages.

Portable equipment such as mobile telephones or audio or video players require integrated circuits in which mean power consumption is minimised, in order to obtain maximum battery life, but which enables correct handling of large signals. One of the elements frequently required is an amplifier and in order to meet the above requirements Class AB CMOS op-amps and buffers are commonly used. A particular problem with such amplifiers is how to set the standing current in the output stage, particularly at low supply voltages. Two significant requirements are to minimise wasted current when no signal is present and to ensure that both the N and P channel drive transistors are not both turned off at the same time as this leads to "cross-over distortion". This latter requirement is particularly onerous at low signal amplitudes.

The output stage of a typical low voltage Class AB CMOS amplifier comprises common source output drivers. Such a construction is chosen in low voltage applications as it allows a signal to swing close to the power rail voltages. In a fully differential version two outputs would be present and there would be common mode feedback both the N and the P channel output transistor gates are driven by a high impedance output of a first stage amplifier. Both gates must rise and fall together with the signal to achieve correct push pull operation. The first stage output levels are, however, not well defined in absolute terms as they are produced at high impedance nodes and they only become well defined when global external feedback is applied. In order to set the minimum output current under no signal conditions it is necessary to know the difference between the gate voltages of the output transistors. One approach is to use simple tolerancing, but this is not a reliable option due to the high impedance nature of the driver nodes.

Previous Class AB amplifiers have frequently used a reference circuit, comprising a series connected chain of N and P devices through which the desired minimum bias current flows, to generate a voltage drop related to the sum of the gate-source voltages of both the N and P channel devices in series. In a source follower type of output this can provide an easy method of setting the bias and is used in many classical audio power amplifiers and bipolar op-amps. For low power supply voltage applications, however, the use of complementary source followers is not an option due to headroom considerations and consequently other solutions must be found. One solution often used is the floating "voltage source" but this has problems with device $V_t$ and saturation voltage.

U.S. Pat. No. 5,475,343 discloses a class AB complementary output stage that provides maximum output voltage swings and high load currents with minimum power dissipation. The output stage includes a first bias circuit that generates a pair of voltage nodes with a resistor controlled bias current. A second bias circuit comprises four current sources the outputs of which are coupled pair-wise across a resistor to form a pair of high impedance nodes at the resistor terminals. The voltage nodes of the first bias circuit establish bias currents in a differential input stage and in a pair of current sources of the second bias circuit. The outputs of the differential input stage drive the inputs of a second pair of current sources in the second bias circuit, which provide drive currents to the high impedance nodes. The output circuit comprises a pair of complementary common source transistors, the gates (bases) of which are driven by the high impedance nodes of the second bias circuit.

SUMMARY OF THE INVENTION

It is an object of the invention to enable the provision of an amplifier having a low power dissipation and operable at low power supply voltages.

The invention provides a class AB amplifier having an output stage comprising complementary common source (or emitter) transistors connected between the power supply rails, first means for setting the (or quiescent) minimum current of the output stage under zero signal conditions, said means comprising a bias resistor through which a bias current is passed and which is connected between the gate (or base) electrodes of the transistors, second means for determining the bias current through the bias resistor, said second means comprising reference current generating means, means for passing the reference current through first and second diode connected complementary reference field effect transistors, means for monitoring the gate (or base) potentials of the first and second reference transistors, and means for applying the gate (or base) potentials to opposite ends of a reference resistor, and third means for sensing the current through the reference resistor and applying a current dependent thereon to the bias resistor.

By providing a reference current source to determine the currents through the reference transistors the currents can be made substantially independent of the supply voltage. Consequently the gate-source (or base-emitter) potentials of the reference transistors remain substantially constant and independent of the supply voltage.

The quiescent current generating means may comprise a first current generator whose output current is passed through the first reference transistor and a second current generator whose output current is passed through the second transistor, the currents produced by the first and second current generators being substantially equal.

The provision of two separate current sources allows the two gate (or base) voltages to become closer together than if a single current source connected between the two reference transistors was used.

The means for monitoring and applying the gate (or base) potential of the second reference transistor to one end of the reference resistor may comprise an operational amplifier.

The means for monitoring and applying the gate (or base) potential of the first reference transistor to the other end of the reference resistor may comprise a buffer amplifier.

Alternatively, the gate (or base) electrode of the first reference transistor may be directly connected to the other end of the reference resistor means being provided for additionally generating a current having a value slightly less than the reference current and applying said current to the other end of the reference resistor.

Means may be provided for reversing the direction of current flow in the bias resistor.

This allows operation at very low power supply voltages when the voltage difference between the two output transistor gates (or bases) may change sign. Such an arrangement is particularly useful with battery powered devices, such as mobile phones, where operation with a wide range of voltages as the charge state of the battery changes with use may be required.

The reversing means may comprise a comparator for comparing the gate (or base) voltages of the first and second reference transistors and switching means for reversing the direction of current flow through the reference and bias resistors in dependence on the output of the comparator.

BRIEF DESCRIPTION OF THE DRAWING

The above and other features and advantages of the invention will be apparent from the following description, by way of example, of embodiments of the invention with reference to the accompanying drawings, in which.

DESCRIPTION OF THE PREFERRED EMBODIMENTS

Figure 1:
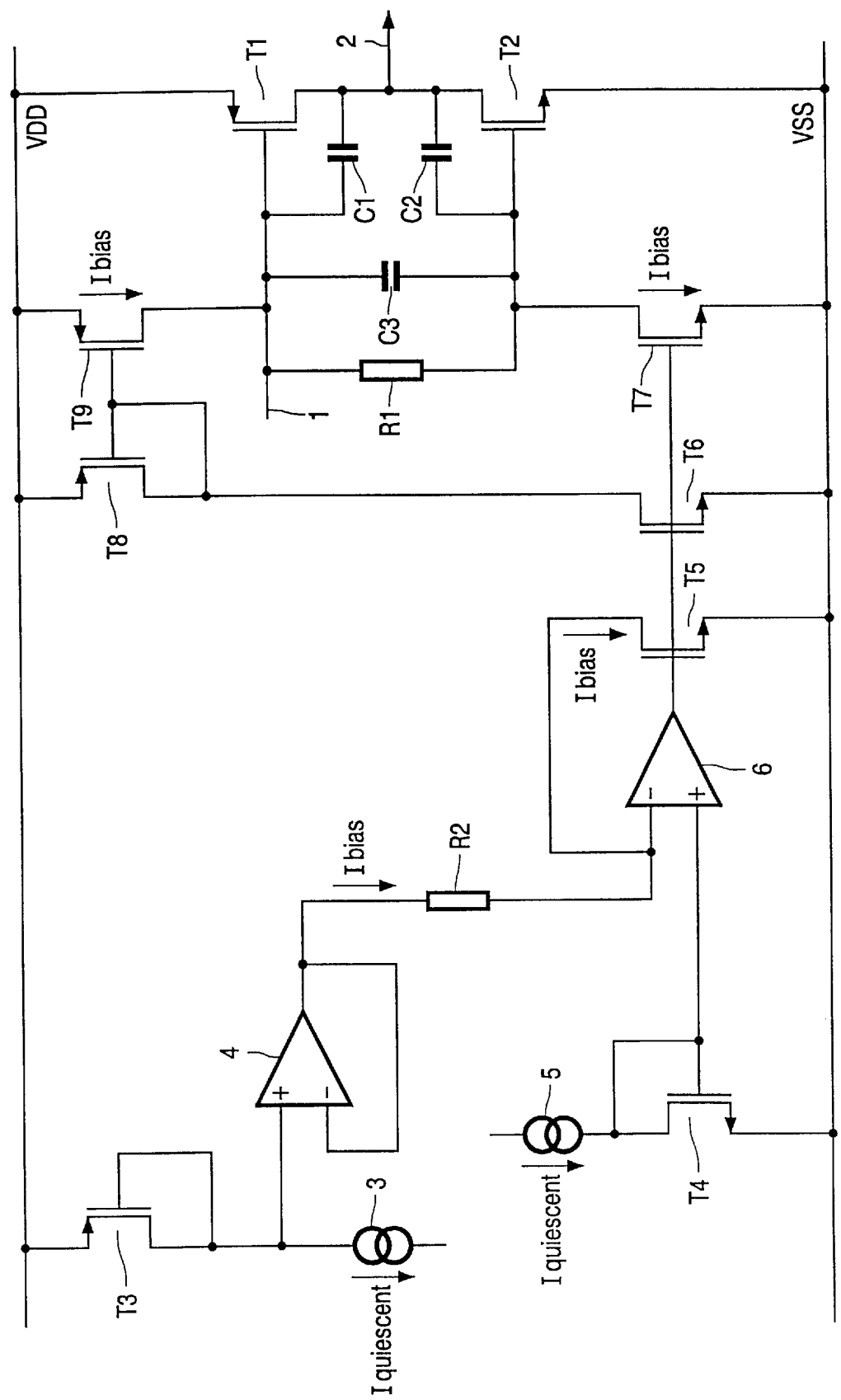
FIG. 1 is a circuit diagram of a first embodiment of an amplifier according to the invention.

FIG. 1 shows the output stage of a Class AB amplifier according to the invention which comprises an input terminal 1 for receiving an input signal, which input terminal is connected to the gate electrode of a P-channel field effect transistor T1 and via a resistor R1 to the gate electrode of an N-channel field effect transistor T2. The drain electrodes of transistors T1 and T2 are connected to an output terminal 2 at which the amplified output signal is made available. The source electrodes of transistors T1 and T2 are connected to supply rails $V_{DD}$ and $V_{SS}$, respectively. A P-channel field effect transistor T3 is diode connected and has its source electrode connected to the supply rail $V_{DD}$ and its gate and drain electrodes connected to a current sink 3 and a non-inverting input of an op-amp 4. A current source 5 is connected to the gate and drain electrodes of an N-channel field effect transistor T4 whose source electrode is connected to the supply rail $V_{SS}$. The gate electrode of transistor T4 is connected to a non-inverting input of an op-amp 6. The inverting input of amplifier 4 is connected to its output and to one end of a resistor R2. The other end of resistor R2 is connected to the inverting input of amplifier 6 and to the drain electrode of an N-channel field effect transistor T5. The output of amplifier 6 is connected to the gate electrode of transistor T5 and to the gate electrodes of two further N-channel field effect transistors T6 and T7. The source electrodes of transistors T5, T6, and T7 are each connected to the supply rail $V_{SS}$. The drain electrode of transistor T6 is connected to the drain electrode of a P-channel field effect transistor T8 whose source electrode is connected to the supply rail $V_{DD}$. The drain electrode of transistor T8 is connected to its gate electrode and to the gate electrode of a P-channel field effect transistor T9 whose source electrode is connected to the supply rail $V_{DD}$. The drain electrode of transistor T9 is connected to the gate electrode of transistor T1 while the drain electrode of transistor T7 is connected to the gate electrode of transistor T2. Compensation capacitors C1 and C2 may be connected between the gate and drain electrodes of transistors T1 and T2, respectively, while a capacitor C3 is connected in parallel with resistor R1.

When the desired offset between the N and P channel output transistors (T1 and T2) becomes very small, that is a few hundred millivolts, the most reliable way of maintaining a stable offset voltage is by passing a current through a resistor (R1). This also avoids gross non-linear behaviour in the signal path. The AC impedance across the resistor must also be kept low so that both transistors are driven in a complementary fashion and this can be achieved, for example, by connecting a large capacitor (C3) in parallel with the resistor. Since the two gates (of transistors T1 and T2) are driven from a high impedance node the offset current are added and subtracted symmetrically at each gate node.

The embodiments shown provide amplifiers in which the correct current may be set despite resistance, $V_t$, and $V_{DD}$ fluctuations.

In the amplifier shown in FIG. 1 the bias current to be passed through resistor R1 is generated by first finding estimates of the absolute gate-source voltages required by two reference transistors T3 and T4 (of the required size) at the required quiescent current specified for the output stage. Because the two gate voltages may become very close in value in a practical application, a common current path cannot necessarily be used to derive reference voltages from which the bias current may be derived. As a result a separate current sink 3 and current source 5 are provided to define the current through transistors T3 and T4 which is equal to the quiescent current through the output transistors T1 and T2. The current sink 3 and current source 5 will be derived by appropriately mirroring the output of a reference current generator which may, for example, be controlled by a band gap reference source. The amplifier 4 acts as a voltage follower to buffer the reference voltage produced at the gate electrode of transistor T3. The reference voltage produced at the gate electrode of transistor T4 is fed to the high impedance non-inverting input of the op-amp 6. The reference resistor R2 is connected between the inverting input of amplifier 6 and the output of amplifier 4. Consequently it has the gate voltages of transistors T3 and T4 impressed upon its ends, since the inverting input of amplifier 6 will follow the potential of the non-inverting input which is connected to the gate electrode of transistor T4. The current fed back by the inverting stage of amplifier 6 supplies the reference current through resistor R2 which is used to define the bias current through resistor R1. This current through resistor R2 can be replicated using the current mirror comprising transistors T5 and T6 to proved both a current source, transistor T9, and a current sink, transistor T7. Thus a defined bias current is passed through the resistor R1 connected between the gate electrodes of the output transistors T1 and T2. The op-amps in the reference current generating loop can be very simple, consisting of a single stage operating at a few μA and thus taking little power.

Preferably the resistors R1 and R2 are equal and equal currents are passed through them. This can be achieved by making transistors T5, T6 and T7 identical to each other and transistors T8 and T9 identical to each other. Clearly it is not essential that the current in the reference resistor R2 is equal to that in the bias resistor R1, the important consideration is that the potential across resistor R1 should be equal to that across resistor R2, but it is convenient to make it so. Different, but related, currents could be generated by appropriate dimensioning of transistors T6 to T9, the potentials being kept equal by appropriate scaling of resistors R1 and R2. It will be apparent that the currents through resistors R1 and R2 are not directly related to the quiescent current through transistors T1 and T2 or the currents through transistors T3 and T4.

Figure 2:
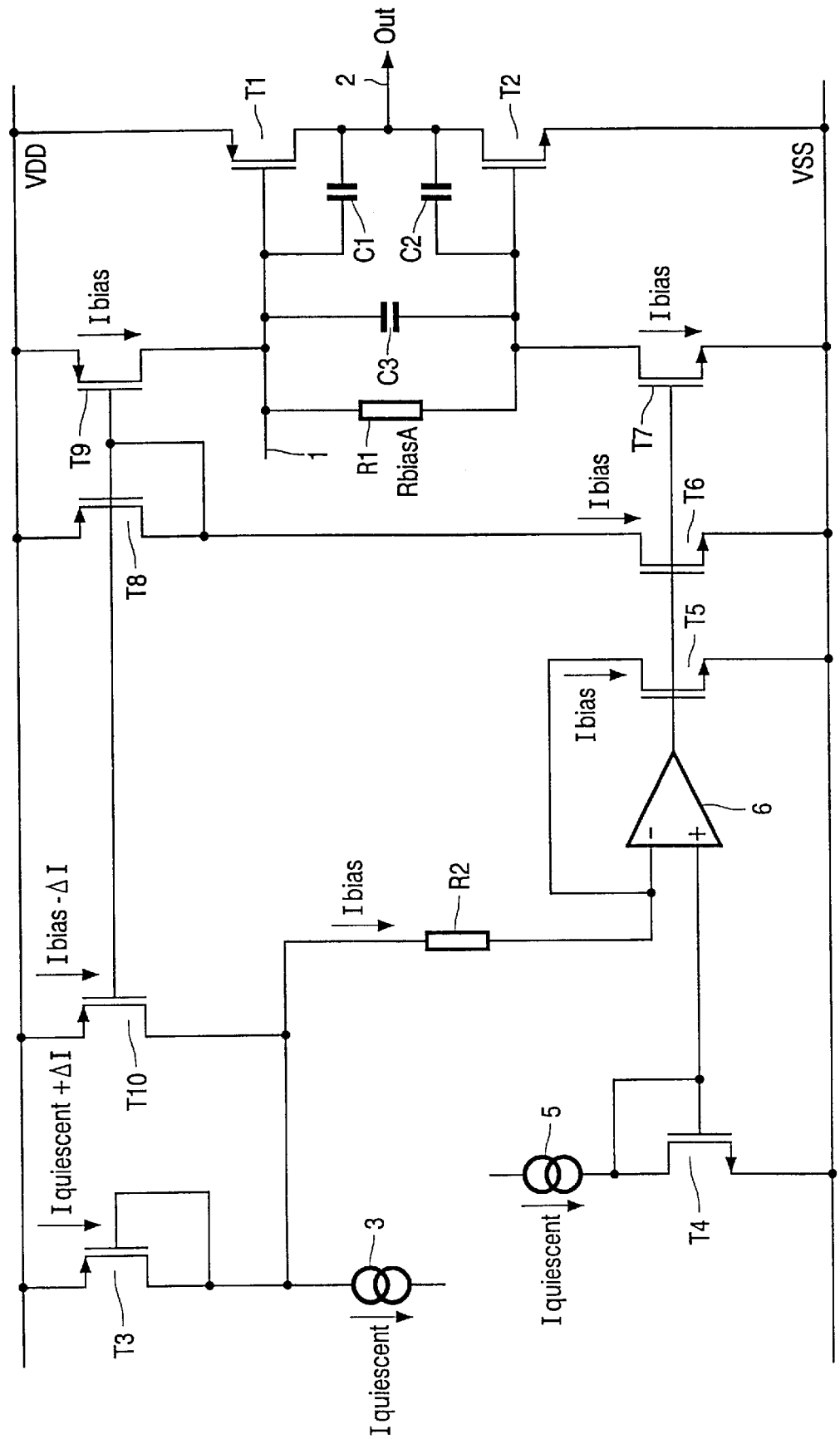
FIG. 2 is a circuit diagram of a second embodiment of an amplifier according to the invention.

FIG. 2 shows an alternative embodiment and in this embodiment the same reference signs are used to designate equivalent elements in FIG. 2 to those in FIG. 1. In the following description only the differences between the embodiments of FIGS. 1 and 2 will be described. As shown in FIG. 2 the amplifier 4 has been omitted and one end of the resistor R2 connected directly to the gate and drain electrodes of transistor T3. In the absence of any other measures this would result in extra current being drawn through transistor T3 upsetting the estimate of the required gate voltage and would degrade the accuracy of the bias voltage through resistor R1. To reduce this degradation a further P-channel field effect transistor T10 is provided. The source electrode of transistor T10 is connected to the supply rail $V_{DD}$, the drain electrode is connected to the one end of resistor R2, and the gate electrode is connected to the gate electrode of transistor T8. This transistor is dimensioned so that it produces a current of slightly less than the reference current through resistor R2 and consequently a current of slightly less than the reference current is re-injected in to the loop. This gives a reduced error without the stability problems that would occur if a full compensation current was injected.

The principle on which the invention is based can be extended to take into account even lower supply voltages. It will be appreciated that with battery powered systems there is a need to cover a wide range of supply voltage values in order to maximise the life of the battery or the time between repeated charging of the battery. As the supply voltage decreases it is possible that the voltage difference between the gate electrodes of the output transistors will change sign. Consequently the currents injected at the gate nodes of transistors T1 and T2 should also change sign. This can be achieved by making the amplifiers used in the reference current generation loop able to sink or source current. One possibility is to provide a structure resembling an inverter at the output of the amplifier 6. For very low supply voltages, below $V_{tn}+V_{tp}$, a simple inverter would be adequate, since the situation where both the N and P sources were activated would not occur. If a wider range of supply voltages are to be catered for it is necessary to ensure that when Vbias=0 the source and sink do not operate against each other. If this is allowed to happen then when mirrored to the gates of transistors T1 and T2 a low impedance node would be presented to the first stage of the amplifier and hence the low frequency gain would fall.

Figure 3:
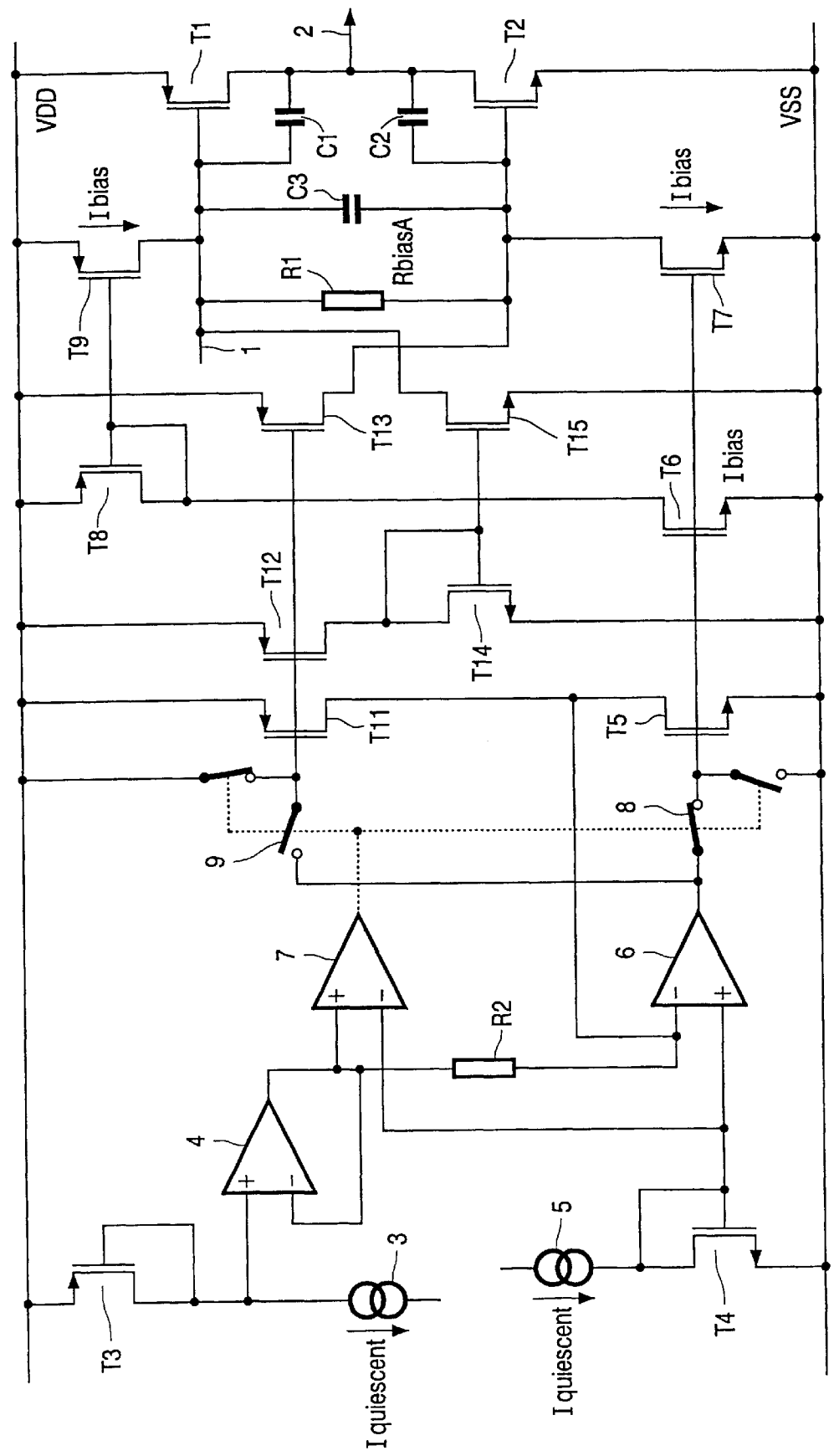
FIG. 3 is a circuit diagram of a third embodiment of an amplifier according to the invention.

FIG. 3 shows an embodiment in which it is possible to reverse the bias current direction in resistor R1 when the power supply voltage decreases to a critical level. Again those elements in FIG. 3 which correspond to elements already described with reference to FIG. 1 have been given the same reference signs as in FIG. 1. Further only the differences between the embodiments of FIGS. 1 and 3 will be discussed in detail below.

As shown in FIG. 3 the output of the amplifier 4 is additionally connected to a first input of a comparator 7, while the gate electrode of transistor T4 is additionally connected to a second input of the comparator 7. The output of the comparator 7 is connected to control inputs of first and second switching arrangements 8 and 9. The drain electrode of transistor T5 is additionally connected to the drain electrode of a P-channel field effect transistor T11 while the output of the op-amp 6 is connected via the switching arrangements 8 and 9 to the gate electrodes of transistors T5 and T11, respectively. The gate electrode of transistor T11 is connected to the gate electrodes of two further P-channel field effect transistors T12 and T13. The source electrodes of transistors T11, T12, and T13 are each connected to the supply rail $V_{DD}$. The drain electrode of transistor T11 is connected to the drain and gate electrodes of an N-channel field effect transistor T14 and to the gate electrode of an N-channel field effect transistor T15. The source electrodes of transistors T14 and T15 are connected to the supply rail Vss. The drain electrode of transistor T13 is connected to the gate electrode of transistor T2 while the drain electrode of transistor T15 is connected to the gate electrode of transistor T1

As will be understood from a consideration of FIG. 3 a bi-directional current sink and source is used for the feedback path of the amplifier 6 and a comparator 7 is added to select whether the source or sink is used to supply the feedback when the required Vbias approaches 0V and to reduce the $V_{gs}$ of the other device to 0V. Thus the current source in the feedback path of the amplifier 6 is formed either by a current source comprising transistor T11 or by a current sink comprising transistor T5 depending on the output of the comparator 7. The output of the comparator 7 controls the state of the switching arrangements 8 and 9 thus connecting either transistor T5 or transistor T11 into the feedback path of amplifier 6.

It will be apparent to the skilled person that when transistor T5 is connected in the feedback path of amplifier 6 transistor T11 has its source and gate electrodes connected together and hence will deliver no current. Consequently transistors T12 to T15 will also deliver no current.

As has previously been described with reference to FIG. 1 transistor T5 conveys the current through the reference resistor R2. Transistors T6 and T7 each form a current mirror with transistor T5, the current through transistor T6 further being passed to the input branch of a current mirror formed by transistors T7 and T9. This results in a current being passed through bias resistor R1 whose magnitude is determined by the currents passed by transistors T7 and T9 and so is related to that passed through the reference resistor R2. The two currents will be equal if transistors T5 to T7 are the same size and transistors T8 and T9 are the same size.

If, however, transistor T11 is connected in the feedback path of amplifier 6 then it will pass the reference current through resistor R2. Clearly this current will pass in the opposite direction through resistor R2. At the same time the gate electrode of transistor T5 is connected to $V_{ss}$ causing transistors T5 to T9 to become non-conducting. Transistors T12 and T13 form respective current mirrors with transistor T11, transistor T12 also feeding the input branch of a current mirror formed by transistors T14 and T15. This results in a current being passed through the bias resistor R1 which is equal (or related to) that passing through the reference resistor R2, this current being conducted via transistors T13 and T15.

Figure 4:
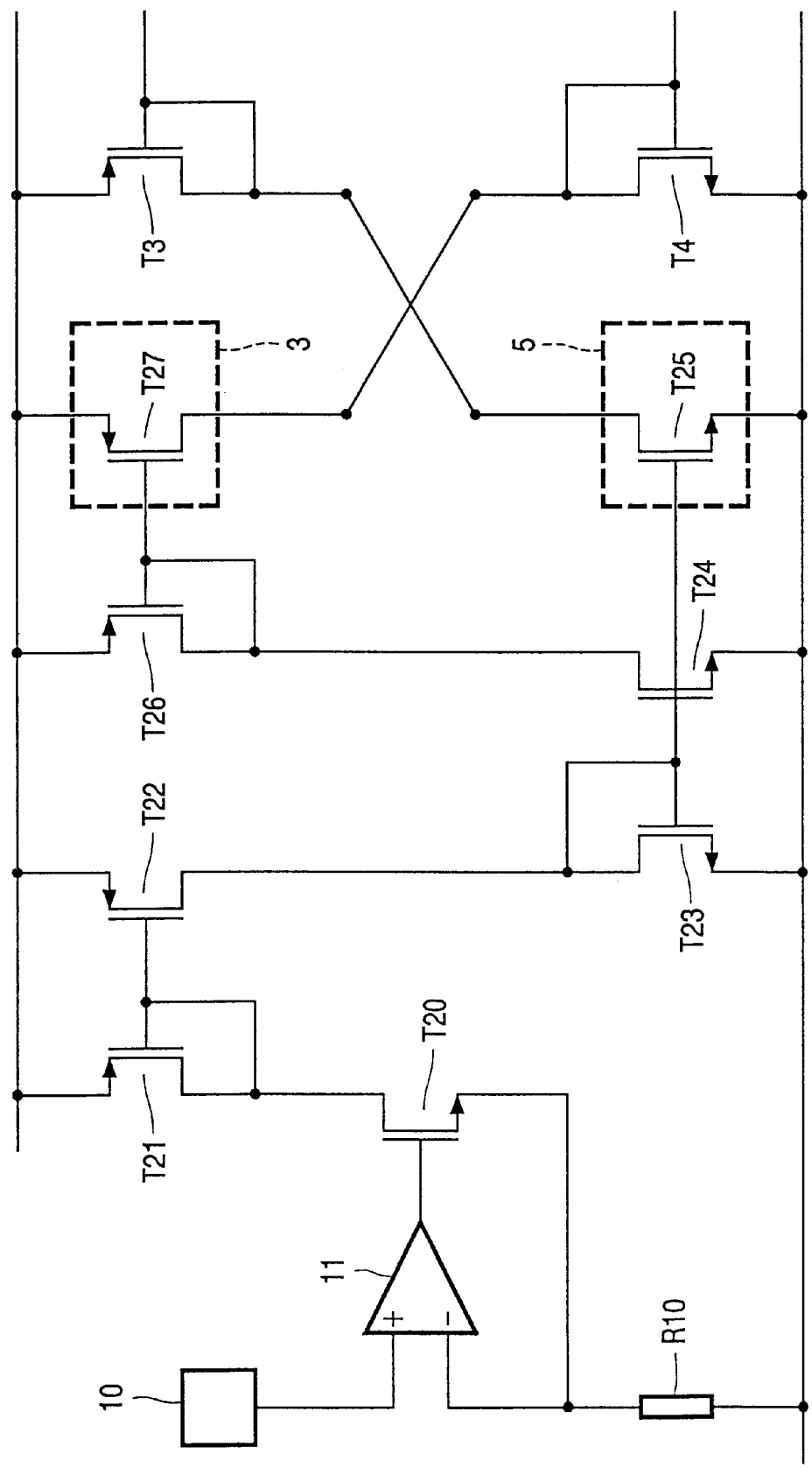
FIG. 4 is a circuit diagram of one embodiment of an arrangement for generating the currents through the first and second reference transistors.

FIG. 4 shows an exemplary embodiment a reference current generator for generating the currents to be applied to transistors T3 and T4. It comprises a bandgap, or other, voltage generator 10 which is connected to a non inverting input of an operational amplifier 11 whose output is connected to the gate electrode of an N channel field effect transistor T20. The source electrode of transistor T20 is connected to an inverting input of the amplifier 11 and via a resistor R10 to the supply rail $V_{SS}$. The drain electrode of transistor T20 is connected to the drain and gate electrodes of a P channel field effect transistor T21 whose source electrode is connected to the supply rail $V_{dd}$. The gate electrode of transistors T21 is further connected to the gate electrode of a P channel field effect transistor T22 whose source electrode is connected to the supply rail $V_{dd}$. The drain electrode of transistor T22 provides a reference current output which is dependent on the bandgap voltage, the value of the resistor R10, and the relative dimensions of transistors T20 to T22.

In order to produce the quiescent current to apply to the reference transistors T3 and T4 the output current from the drain electrode of transistor T22 is fed to the gate and drain electrodes of an N channel field effect transistor T23 whose source electrode is connected to the supply raid $V_{SS}$. Transistor T23 forms the input branch of a current mirror having two output branches formed by N channel field effect transistors T24 and T25 whose gate electrodes are connected to the gate electrode of transistors T23 and whose source electrodes are connected to the supply rail $V_{SS}$. The drain electrode of transistor T24 is connected to the drain and gate electrodes of a P channel field effect transistor T26 whose source electrode is connected to the supply rail $V_{dd}$. Transistor T26 forms the input branch of a current mirror circuit whose output branch is formed by an N channel field effect transistor T27 whose gate electrode is connected to the gate electrode of transistor T26 and whose source electrode is connected to the supply rail $V_{dd}$. Transistors T27 forms the current source 3 of FIGS. 1 to 3 and has its drain electrode connected to the drain and gate electrodes of transistor T4. Similarly transistor T25 forms the current sink 5 of FIGS. 1 to 3 and has its drain electrode connected to the gate and drain electrodes of transistor T3.

It will be clear that the minimum or quiescent current of the output stage of the amplifier is set to a value which is determined by the band gap voltage and the resistance of resistor R10 and is therefore substantially independent of supply voltage variations. The current through transistor T3 and T4 is equal to that through transistors T1 and T2 but does not directly bear any relationship with the current through the bias resistor R1 or reference resistor R2. The bias current will be a factor of the difference between the gate voltages of transistors T1 and T2 (or T3 and T4) but the resistor values will also determine the actual value of bias current.

While the embodiments of class AB amplifier described with reference to FIGS. 1 to 4 use field effect transistors the invention is equally applicable to class AB amplifiers using bipolar transistors and no substantial change to the circuit topology or mode of operation would be required.

From reading the present disclosure, other modifications will be apparent to persons skilled in the art. Such modifications may involve other features which are already known in the design and use of amplifiers and which may be used instead of or in addition to features already described herein. Although claims have been formulated in this application to particular combinations of features, it should be understood that the scope of the disclosure of the present application also includes any novel feature or any novel combination of features disclosed herein either explicity or any generalisation of one or more of those features which would be obvious to persons skilled in the art, whether or not it relates to the same invention as presently claimed in any claim and whether or not it mitigates any or all of the same technical problems as does the present invention. THe applicants hereby give notice that new claims may be formulated to such features and/or combinations of such features during the prosecution of the present application or of any further application derived therefrom.

What is claimed is:

1. A class AB amplifier having an output stage comprising complementary common source (or emitter) transistors connected between the power supply rails, first means for setting the minimum (or quiescent) current of the output stage under zero signal conditions, said means comprising a bias resistor through which a bias current is passed and which is connected between the gate (or base) electrodes of the transistors, second means for determining the bias current through the bias resistor, said second means comprising reference current generating means, means for passing the reference current through first and second complementary reference transistors, means for monitoring the gate (or base) potentials of the first and second reference transistors, and means for applying the gate (or base) potentials to opposite ends of a reference resistor, and third means for sensing the current through the reference resistor and applying a current dependent thereon to the bias resistor.

2. A class AB amplifier as claimed in claim 1 in which the quiescent current generating means comprises a first current generator whose output current is passed through the first reference transistor and a second current generator whose output current is passed through the second reference transistor, the currents produced by the first and second current generators being substantially equal.

3. A class AB amplifier as claimed in claim 1 in which the means for monitoring and applying the gate (or base) potential of the second reference transistor to one end of the reference resistor comprises an operational amplifier.

4. A class AB amplifier as claimed in claim 1 in which the means for monitoring and applying the gate (or base) potential of the first reference transistor to the other end of the reference resistor comprises a buffer amplifier.

5. A class AB amplifier as claimed in claim 1 in which the gate (or base) electrode of the first reference transistor is directly connected to the other end of the reference resistor and means is provided for additionally generating a current having a value slightly less than the reference current and applying said current to the other end of the reference resistor.

6. A class AB amplifier as claimed in claim 1 comprising means for reversing the direction of current flow in the bias resistor.

7. A class AB amplifier as claimed in claim 6 comprising a comparator for comparing the gate (or base) voltages of the first and second reference transistors and switching means for reversing the direction of current flow through the reference and bias resistors in dependence on the output of the comparator.

* * * * *